(12) United States Patent
Kang et al.

(10) Patent No.: US 11,060,953 B2
(45) Date of Patent: Jul. 13, 2021

(54) ENGINE VIRTUAL TEST ENVIRONMENT SYSTEM AND ENGINE MANAGEMENT SYSTEM MAPPING METHOD

(71) Applicants: HYUNDAI MOTOR COMPANY, Seoul (KR); KIA MOTORS CORPORATION, Seoul (KR)

(72) Inventors: Jin-Suk Kang, Seoul (KR); Hyeong-Sang Lee, Seoul (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 16/221,168

(22) Filed: Dec. 14, 2018

(65) Prior Publication Data
US 2020/0064229 A1 Feb. 27, 2020

(30) Foreign Application Priority Data

Aug. 27, 2018 (KR) .......................... 10-2018-0100179

(51) Int. Cl.
| | |
|---|---|
| *B60T 7/12* | (2006.01) |
| *G01M 15/05* | (2006.01) |
| *F02D 41/14* | (2006.01) |

(52) U.S. Cl.
CPC .......... *G01M 15/05* (2013.01); *F02D 41/1401* (2013.01); *F02D 2041/1437* (2013.01)

(58) Field of Classification Search
CPC .... F02D 19/025; F02D 19/0623; F02D 41/22; F02D 41/266

USPC ................................. 701/101, 102, 114, 115
See application file for complete search history.

(56) References Cited

U.S. PATENT DOCUMENTS

| | | | | |
|---|---|---|---|---|
| 2006/0280223 | A1* | 12/2006 | Clayton | .................. G06F 30/23 374/29 |
| 2007/0156323 | A1* | 7/2007 | Urano | ................... G01M 15/05 701/113 |
| 2007/0265805 | A1* | 11/2007 | Lee | ........................ G01M 15/05 702/187 |
| 2008/0306671 | A1* | 12/2008 | Nakano | ................. G01M 15/05 701/102 |

(Continued)

FOREIGN PATENT DOCUMENTS

| | | |
|---|---|---|
| JP | 2008-224290 A | 9/2008 |
| JP | 2011-022935 A | 2/2011 |

(Continued)

*Primary Examiner* — John Kwon
(74) *Attorney, Agent, or Firm* — Morgan, Lewis & Bockius LLP

(57) ABSTRACT

An engine virtual test environment system may include at least one memory and at least one processor configured to perform a virtual engine test and generate a virtual engine to which a physics-based model and a data-driven model are applied to replace an engine. The at least one memory may be configured to store a physics-based model representing the actual structure of an engine by any one of simulation, phenomenological relationship expression, physical characteristic change of constituent elements, a combust model, an ECU model, and an engine model, and a data-driven model representing the actual operation of the engine by any one of a test model, a mathematical model, modeling, engine DoE techniques, mathematical and statistical techniques, a driving range.

14 Claims, 6 Drawing Sheets

(56) References Cited

U.S. PATENT DOCUMENTS

| | | | | |
|---|---|---|---|---|
| 2009/0187390 A1* | 7/2009 | Urano | ................ | F02D 41/2432 703/7 |
| 2009/0192774 A1* | 7/2009 | Urano | ................ | F02D 41/2432 703/7 |
| 2015/0212920 A1* | 7/2015 | Kraus | ................ | G06F 11/36 717/127 |
| 2015/0220423 A1* | 8/2015 | Kraus | ................ | G06F 11/3684 717/135 |
| 2020/0064229 A1* | 2/2020 | Kang | ................ | G01M 15/05 |

FOREIGN PATENT DOCUMENTS

| | | |
|---|---|---|
| JP | 2013-137023 A | 7/2013 |
| JP | 2017-173309 A | 9/2017 |
| KR | 10-0686359 B1 | 2/2007 |
| KR | 10-1205247 B1 | 11/2012 |

* cited by examiner

US 11,060,953 B2

ENGINE VIRTUAL TEST ENVIRONMENT SYSTEM AND ENGINE MANAGEMENT SYSTEM MAPPING METHOD

CROSS-REFERENCE TO RELATED APPLICATION

This application is based on and claims the benefit of priority to Korean Patent Application No. 10-2018-0100179, filed on Aug. 27, 2018, which is incorporated herein by reference in its entirety.

TECHNICAL FIELD

The present disclosure relates to an EMS (Engine Management System) mapping of an engine of a vehicle, and more particularly, the present disclosure relates to a method capable of mapping a virtual test result obtained in an engine virtual test environment system that can evaluate a virtual engine like an actual engine.

BACKGROUND

Generally, the exhaust gas regulation of vehicles requires stringent EM (Emission Material) regulation for engines. Particularly, a diesel engine has been more stringent in the exhaust gas regulation.

For this, the diesel engine applies EMS (Engine Management System) mapping unlike a gasoline engine. The EMS mapping uses an exhaust gas recirculation (EGR), boost, multi-stage injection time, pressure, and flow rate as combustion control factors, and maps the combustion control factors to each vehicle development stage, and then, repeats the verification process, so that the combustion control factors optimization mapping is achieved. In this case, the EMS mapping is loaded into an EMS ECU (Electronic Control Unit).

Therefore, the diesel engine can meet the exhaust gas regulations with raw EM control through EMS mapping.

In recent years, the EU6d, which is an enhanced exhaust gas regulation for diesel engines, has regulated that the exhaust gas evaluation should be made on the actual road through the actual road condition exhaust emission standard of the RDE (Real Driving Emission) unlike the chassis dynamo evaluation mode of NEDC (New European Driving Cycle) and WLTP (Worldwide Light Vehicle Test Procedure).

However, the conventional EMS mapping applied to the diesel engines has a fundamental limitation that it cannot reflect the RDE item. The reason for this is because the RDE is not possible to accurately reproduce the driving conditions such as road type, outdoor temperature and pressure, traffic conditions, driving method, and the like as well as the exhaust gas amount should be kept equal to or lower than regulation value even under certain driving conditions.

Therefore, the diesel engine has been required to overcome the limitation of the conventional EMS mapping in calibration and verification of the diesel engine together with introduction of RDE regulation.

The foregoing is intended merely to aid in the understanding of the background of the present disclosure, and is not intended to mean that the present disclosure falls within the purview of the related art that is already known to those skilled in the art.

SUMMARY

The present disclosure has been made to solve the above problems and the object thereof is to provide an engine virtual test environment system and EMS (Engine Management System) mapping method that evaluates and maps a virtual engine like an actual engine with an engine virtual test environment system so that the test results can be utilized in an actual engine and a vehicle, and particularly, the evaluation for the performance of various actual road conditions and EM prediction required by RDE regulation through the virtual engine to which a physics-based model and a data-driven model as an engine model are combined is performed so that it is possible to secure time/space freedom of the EMS mapping, and verify various conditions difficult to evaluate in the actual engines and vehicles.

An engine virtual test environment system according to the present disclosure in order to achieve the above object may include at least one memory; and at least one processor configured to perform a virtual engine test and generate a virtual engine to which a physics-based model and a data-driven model are applied to replace an engine. The at least one memory may be configure to store the physics-based model representing any one of simulation, phenomenological relationship expression, physical characteristic change of constituent elements, a combust model, an ECU model, and an engine model. The at least one memory may be further configured to store the data-driven model representing any one of a test model, a mathematical model, modeling, Engine DoE techniques, mathematical and statistical techniques, driving range.

As a preferred exemplary embodiment, the physics-based model may be a 1-D Fast Running Model or Mean Value Engine Model and a Data Regression Model may be applied to the test engine model.

As a preferred exemplary embodiment, the simulation may represent entire characteristics of the engine with an intake system, an exhaust system, a turbocharger, an intercooler, an EGR system, a cylinder, a crankshaft, an intake and exhaust valve, and express steady-state and transient response to the engine.

The phenomenological relationship expression may describe the phenomenon associated with the flow, combustion and friction inside the cylinder of the engine.

The combust model may generate a combustibility prediction result that predicts the performance, fuel efficiency and EM of the engine, the ECU model may change a turbo charger vane opening and an EGR valve opening, and the engine model may provide a fast running speed while maintaining the same physical characteristics on the intake system and the exhaust system.

As a preferred exemplary embodiment, the test model may provide a basic output of the virtual engine, the mathematical model may express the relationship between output characteristics on the combination of engine control variables and the modeling may provide monitoring on the output of a virtual input.

The Engine DoE techniques may provide a variation range of an input and an output and input variables, and the mathematical and statistical techniques may provide output prediction for specific input conditions and mapping optimization, and cycle cumulative value minimization directions for driving trajectories.

The driving range may provide the actually usable range of the engine control variables.

As a preferred exemplary embodiment, the virtual engine may be applied to a control lab and the control lab may be linked to a target profiler, a dynamo controller, an EMS ECU, respectively.

As a preferred exemplary embodiment, the target profiler may acquire a target speed and a target torque profile for an engine dynamo by applying any one of any specified value, a storage profile, or an analysis program.

As a preferred exemplary embodiment, the dynamo controller may drive and control the virtual engine depending on the target profiler to provide automation functions for driving mode determination, target profile setting and display and storage of the measure values of the virtual engine temperature and pressure.

Particularly, the driving mode determination may be achieved by any one of an engine speed and an engine torque, an engine speed and a fuel injection amount, an engine speed and accelerator pedal opening, an engine speed and a BMEP (Brake Mean Effective Pressure).

As a preferred exemplary embodiment, the control lab may load the physics-based model and the data-driven model into the EMS ECU, perform the hardware specification evaluation for the engine with the physics-based model, derive the mapping result for the engine after evaluating the steady-state, transient state and environmental conditions by the data-driven model, and the derived result may be applied to the actual engine and vehicle for RDE (Real Driving Emission) evaluation.

As a preferred exemplary embodiment, the EMS ECU may load the physics-based model and the data-driven model into an ECU model to establish the ECU model, and the ECU model may be provided with an ECU map to which a control target value generated by receiving from the dynamo controller any one of a fuel injection pressure, a multi-stage injection number, a fuel injection time, a fuel injection amount, a boost pressure, an EGR flow rate of the virtual engine depending on an engine rotation speed and an accelerator pedal opening, may be applied.

Particularly, the ECU model may reflect the current value of physics-based model to the data-driven model when the transient response characteristic should be considered.

An EMS (Engine Management System) mapping method according to the present disclosure in order to achieve the above object may include generating a virtual engine that divides an actual engine into a physics-based model and a data-driven model in an engine virtual test environment system; making virtual test conditions setting of the virtual engine in the engine virtual test environment system in order to optimize the data for a performance, fuel efficiency and EM (Emission Material) of the engine; performing the virtual test using the physics-based model or the data-driven model in the engine virtual test environment system by applying the virtual test conditions; and mapping optimum data of the performance, fuel efficiency and EM obtained from the virtual test to the engine from the engine virtual test environment system for RDE (Real Driving Emission) evaluation.

As a preferred exemplary embodiment, the mapping may reset the virtual test conditions when the optimum data of the performance, fuel efficiency and EM are not obtained, and go through the optimization process consisting of the optimum data of the performance, fuel efficiency and EM obtained by the reset.

As a preferred exemplary embodiment, the engine virtual test environment system may receive feedback from the engine trajectories depending on the exhaust gas regulation test evaluation result of the engine and apply the data of the engine trajectories to the condition update for the physics-based model and the data-driven model.

Particularly, the condition update may be applied to re-acquire the optimum data of the performance, fuel efficiency and EM.

The present disclosure provides the following actions and effects by satisfying the RDE regulations through EMS mapping using the virtual test result of the engine virtual test environment system.

First, a new technique for predicting and mapping the performance and EM of various actual road conditions according to the introduction of RDE regulations is applied to engines, particularly diesel engines.

Second, virtual test results evaluating the virtual engine like the actual engine can be utilized in the actual engine and the vehicle by EMS mapping through loading of EMS ECU.

Third, the virtual engine through the combination of the physics-based model and the data-driven model and the virtual test environment that can evaluate the virtual engine are realized, thereby securing the time and space freedom of EMS mapping.

Fourth, it is easy to verify various conditions that are difficult to evaluate in the actual engine and vehicle required by RDE.

Fifth, it is possible to smoothly collaborate with the engine object and the vehicle test.

Sixth, the virtual test environment system combines the physics-based model and the data-driven model, so that various methods such as the calibration engineer's arbitrary-designation for the target speed and target torque profile of the engine dynamo, or engine torque measurement by matching the fuel amount profile through the actuality or test and the storage profile of the engine dynamo, or derivation of an engine rotation speed and a required engine torque using analysis program of dynamic behavior simulation of the vehicle, can be realized.

BRIEF DESCRIPTION OF THE DRAWINGS

The above and other objects, features and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings. It is to be understood that the present disclosure is not limited to the above-described embodiments, and various changes and modifications may be made by those skilled in the art without departing from the spirit and scope of the present disclosure.

Figure 1:
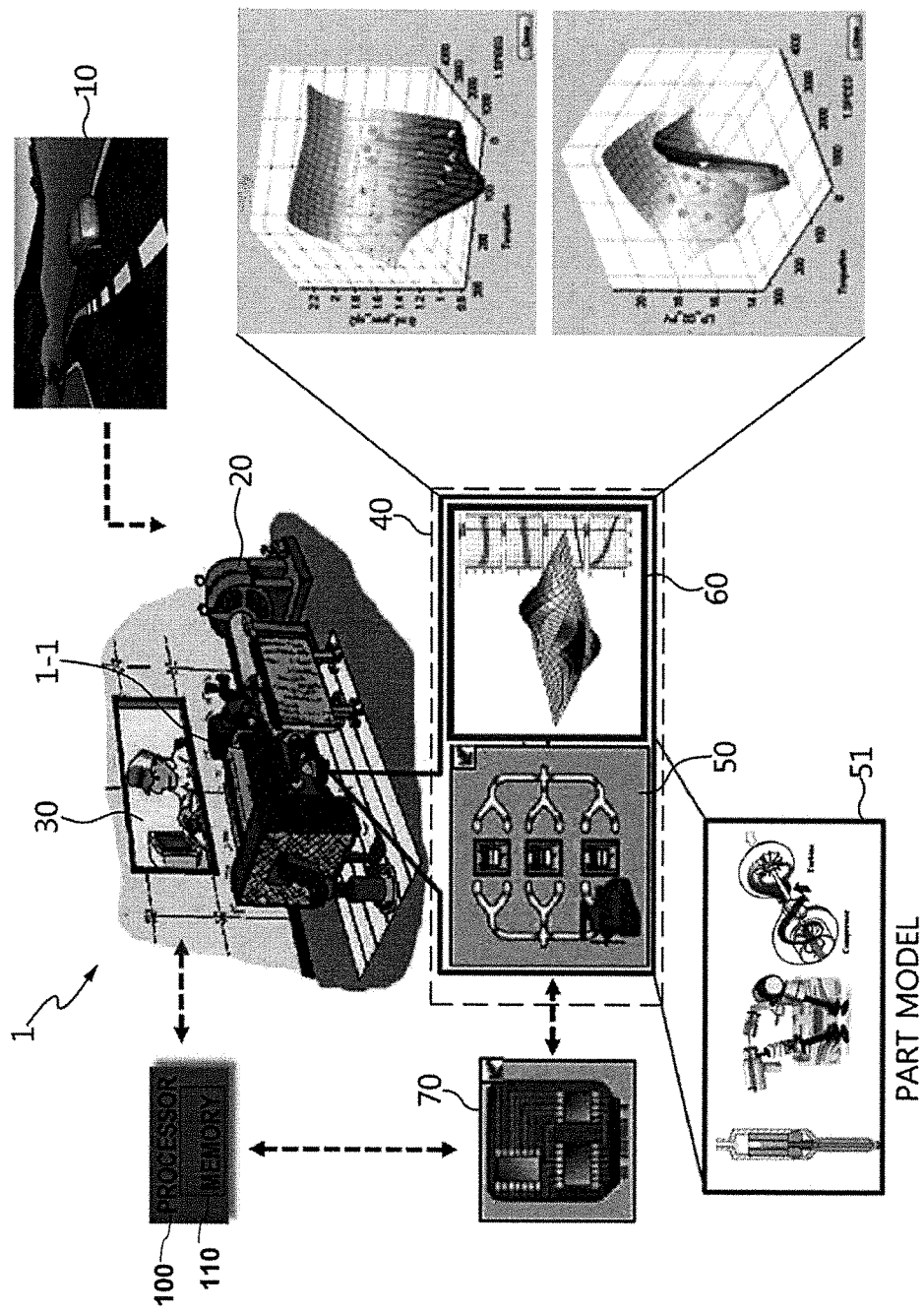
FIG. 1 is an example of the configuration of an engine virtual test environment system according to the present disclosure.

Referring to FIG. 1, an engine virtual test environment system 1 may include at least one processor 100 and at least one memory 110. The at least one memory 110 is configured to store functions of the at least one processor 100. The engine virtual test environment system 1 may further include a target profiler 10, a dynamo controller 20 controlling an engine dynamo 1-1 as a simulation engine experiment device, a control lab 30, a virtual engine 40, an EMS ECU (Engine Management System Electronic Control Unit) 70, which are communicatively connected with the at least one processor 100.

Specifically, the target profiler 10 represents the actual vehicle driving conditions as a vehicle, driver and road model and obtains an engine rotation speed (e.g., an engine target speed) and an engine torque profile (for example, target torque profile) of the engine (or a virtual engine) operated in the engine dynamo 1-1. The target speed and the target torque profile can be obtained by one of three ways. A first method may be a method arbitrary designated by a calibration engineer. A second method may be a method that stores the engine rotation speed and an injecting fuel amount profile by running the actual vehicle on the chassis dynamo or real road and measures the engine torque while injecting fuel according to the profile stored in engine dynamo 1-1. A third method may be a method that derives the engine rotation speed and the required engine torque using an analysis program that can simulate the dynamic behavior of the vehicle depending on the road type and characteristics of the driver.

Specifically, the dynamo controller 20 may take charge of driving and controlling the virtual engine and compares the current engine rotation speed and torque of the virtual engine depending on the engine rotation speed and torque profile generated by the target profiler 10 with targets to control the rotation speed and fuel injection amount of the virtual engine. Particularly, the dynamo controller 20 may provide automation functions for the virtual engine operation and control. The automation may be implemented by the dynamo controller 20 to determine the driving mode, to set the target profile, and to display and store the temperature and pressure measure values of the virtual engine 40. More particularly, the driving mode determination may be achieved by applying any one among of the engine speed and engine torque, the engine speed and fuel injection amount, the engine speed and accelerator pedal opening, and the engine speed and BMEP (Brake Mean Effective Pressure).

Specifically, the control lab 30 may perform hardware specification evaluation and EMS calibration (mapping) in virtual test environment. In the virtual test environment, the hardware specification evaluation may be performed in the same way for the same items as the hardware specification evaluation performed in the actual engine after replacing the part model of the virtual engine (the physics-based model). The EMS calibration (mapping) may be performed by performing the basic calibration (mapping) using the optimal solution according to the data-driven model, and then evaluating the influences of the steady state, transient state, and environmental condition in the virtual test environment to derive the improved calibration (mapping) results, and loading the derived results into the ECU (EMS ECU 70 or actual ECU) to evaluate and verify in the actual engine and vehicle.

Specifically, the virtual engine 40 may be divided into a physics-based model 50, which is a 1-D Fast Running Model, and a data-driven model 60, which is a data regression model, and the physics-based model 50 may include a part model DB (database) 51. Particularly, only the data-driven model or the physics-based model may be used alone. The physics-based model 50 and the data-driven model 60 may be stored in the at least one memory 110.

For example, the physics-based model 50 has the part model DB 51 and is constructed as the 1-D Fast Running Model. The 1-D Fast Running Model defines simulation, phenomenological relationship expression, physical characteristic change of constituent elements, combust model, ECU model, and engine model as follows.

Particularly, the simulation may simulate the characteristics from the main components of the engine to the engine as a whole integrated with the main components of the engine such as intake system, exhaust system, turbocharger, intercooler, EGR system, cylinder, crankshaft, intake and exhaust valve, etc. according to the hydrodynamics, thermodynamics and dynamic principles, and keeps the main physical properties of the components such as inertia mass, and the like equal to the actual object in order to simulate not only the steady-state but also the transient response of the engine.

Particularly, since the phenomenological relationship expression actually uses the abnormal, nonlinear, 1D Navier-Stokes equations for fluid behavior in the physics-based model, it is possible to describe complex phenomena related to the flow, combustion and friction inside the cylinder. The physical characteristic changes of the constituent elements may be made simple by changing the number of specification, materials, properties, and the like of the parts.

More particularly, the combust model may be a predictive model that predicts combustion rate that varies depending on the pressure, temperature in the combustion chamber, composition of the mixer, and the injection timing at each injection point and injection rate. Therefore, the combust model may predict the performance, fuel efficiency and EM of the engine as a result of the prediction of the combustion rate.

In addition to the EGR valve opening and the turbocharger vane opening of the physical model 50, the ECU model also may provide values necessary for the injector model operation, such as fuel injection pressure, number of multi-injection, fuel injection timing, fuel injection amount, and the like. Therefore, the ECU model may generate a target value for the operation of the injector model connected with the combust model of the cylinder, and target values of the boost pressure and the EGR flow rate for changing the vane opening and EGR valve opening of the turbine model associated with the physics-based model. The engine model may increase the length of the sub-volume of the intake system and the exhaust system and correct the thermal flow characteristic, enabling the implementation of fast running speed while maintaining the same physical characteristic.

For example, the data-driven model 60 may be a data regression model that is constructed from data acquired through engine testing under steady-state engine driving conditions and defines a test model, mathematical model, modeling, Engine DoE techniques, mathematical/statistical techniques, operating ranges as follows.

Particularly, the test model predicts and complements the output that is physically difficult to model, and the relationship between input and output is modeled regardless of the possibility of physical analysis, and it reflects the actual result, so that the output of the test model can be used as the base output of the steady-state reference virtual engine. The mathematical model is mathematically modeled for the correlation between the engine output (response) characteristics for the combination of engine control variables included in the measured data. The modeling may be defined as EMS mapping variables for the model input, such as an EGR valve opening, turbocharger vane opening, fuel injection pressure, multi-stage injection number, fuel injection timing, the target value of fuel injection amount and the boost pressure generated in the ECU model, the boost pressure and the target value (when transient response is not considered) of the EGR flow rate of the test engine model 60 or the boost pressure and the current value (when transient response is considered) of the EGR flow rate of the physical engine model 50, and the like, and also, output monitoring for virtual inputs is possible through modeling of all outputs that are changed depending on the inputs of the temperature of each part, A/F, turbo speed, actuator opening, and the like, based on the emission and fuel efficiency by each composition for the model outputs.

Particularly, the Engine DoE techniques may be performed by predefining the engine operating region and the mapping combination included in the engine model for the change range of input and output and input variables of the model. The mathematical/statistical techniques may be used not only to predict the output for a particular input condition but also to derive an optimal mapping strategy, which means to find the mapping combination of directions that minimizes the cycle accumulation value for the driving trajectory within the constraint condition through mathematical and statistical techniques.

Furthermore, since the range of the operation is configured to be within the effective operating range of the engine, the engine control variables, which are input to the model during the engine test, are variable within an actual usable range.

Specifically, the EMS ECU 70 is used as a model-based controller for controlling the virtual engine 40, and the EMS includes an ECU model 71 to control the boost pressure and the EGR flow rate. Particularly, The ECU model 71 may generate control target values for the EGR valve opening and turbocharger vane opening, fuel injection pressure, multi-stage injection number, fuel injection timing, fuel injection amount, boost pressure and EGR flow rate of the virtual engine depending on the engine rotation speed and accelerator pedal opening input from the dynamo controller 20 and apply the ECU map for generating the control target values. Further, the ECU model inputs the generated target values to the physics-based model 50 and the data-driven model 60, and if the transient response characteristic consideration is needed, the current value of the physics-based model 50 controlled through the model-based controller is input to data-driven model 60.

Figure 2:
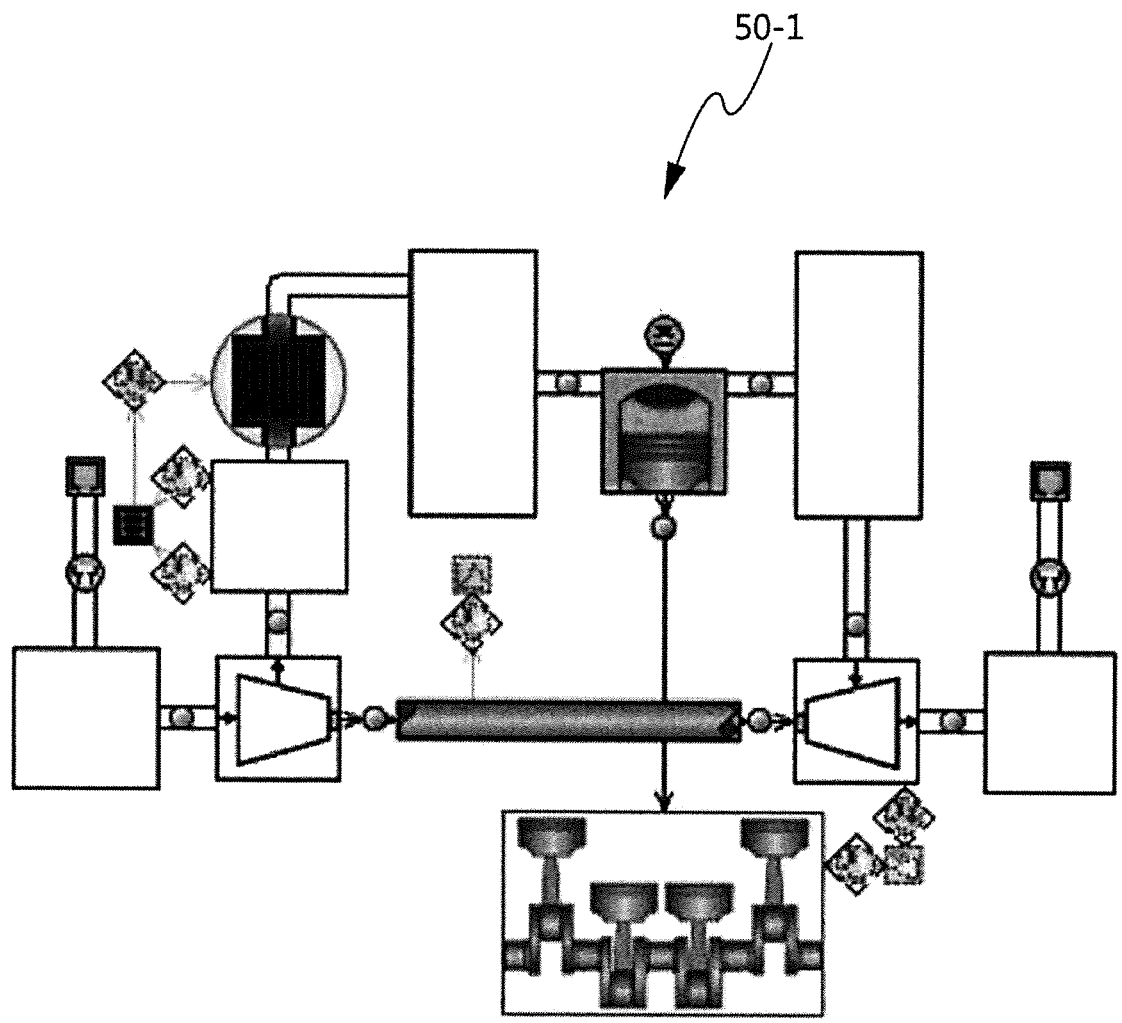
FIG. 2 is an example of constructing the physics-based model applied to the engine virtual test environment system according to the present disclosure using a mean value engine model (MVEM) instead of a 1-D fast running model.
Figure 3:
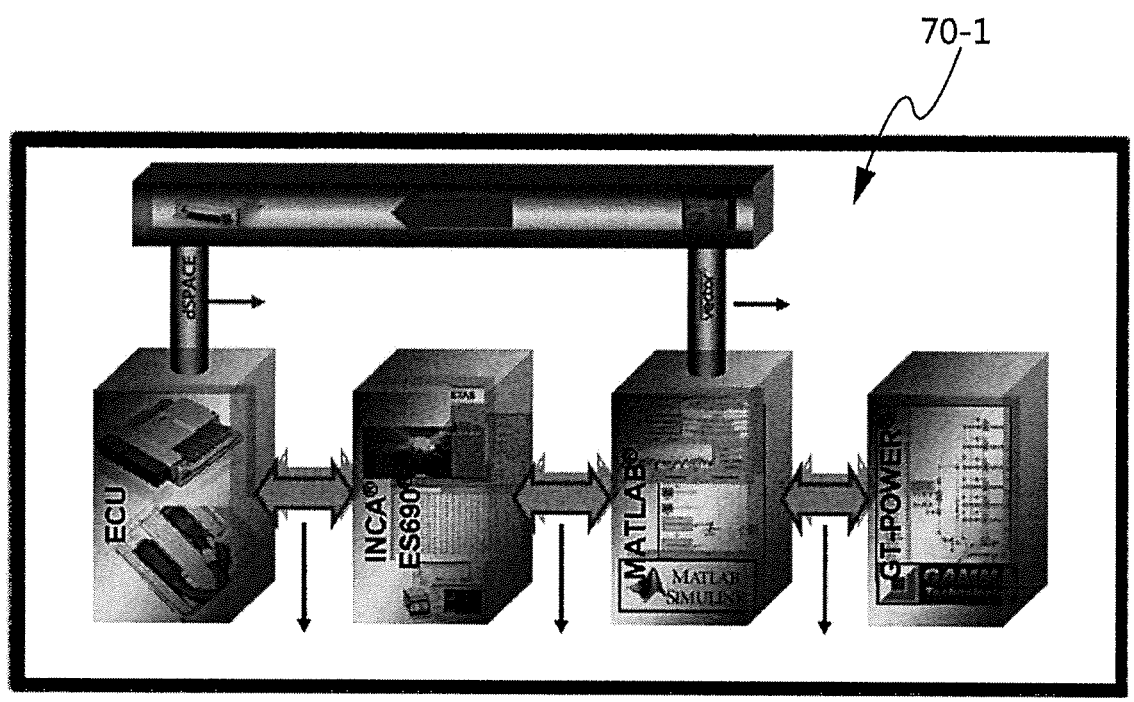
FIG. 3 is an example of constructing an EMS model applied to an engine virtual test environment system according to the present disclosure with an actual ECU.

Meanwhile, FIG. 2 and FIG. 3 show examples of building a simple system for an engine virtual test environment system 1.

FIG. 2 is an example where a simple physics-based model 50-1 constructed with a Mean Value Engine Model is applied to the engine virtual test environment system 1. Since the Mean Value Engine Model is constructed as a simple model compared to the 1-D Fast Running Model of physics-based model 50, it can have the limitation that the cycle average value and the combustion rate cannot be predicted.

FIG. 3 is an example where an actual ECU is applied to the engine virtual test environment system 1. The actual ECU differs from the ECU model of the EMS ECU 70 that it is constructed as a physical engine model by connecting NCA ES690™, MATLAB™ and GT-POWER™ through an interface.

Figure 4:
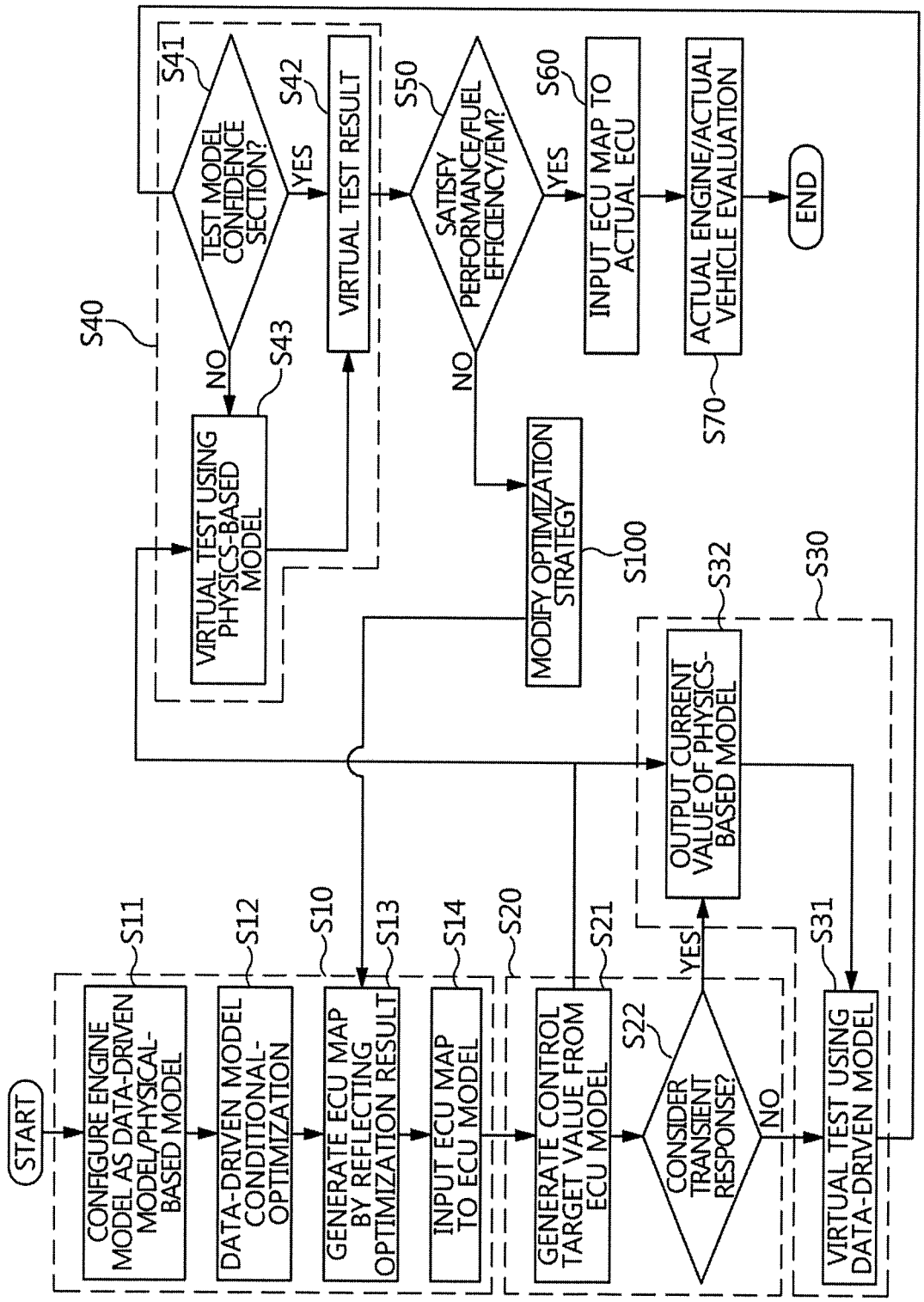
FIG. 4 is a flowchart of the EMS mapping method applied to the engine using the engine virtual test environment system according to the present disclosure.
Figure 5:
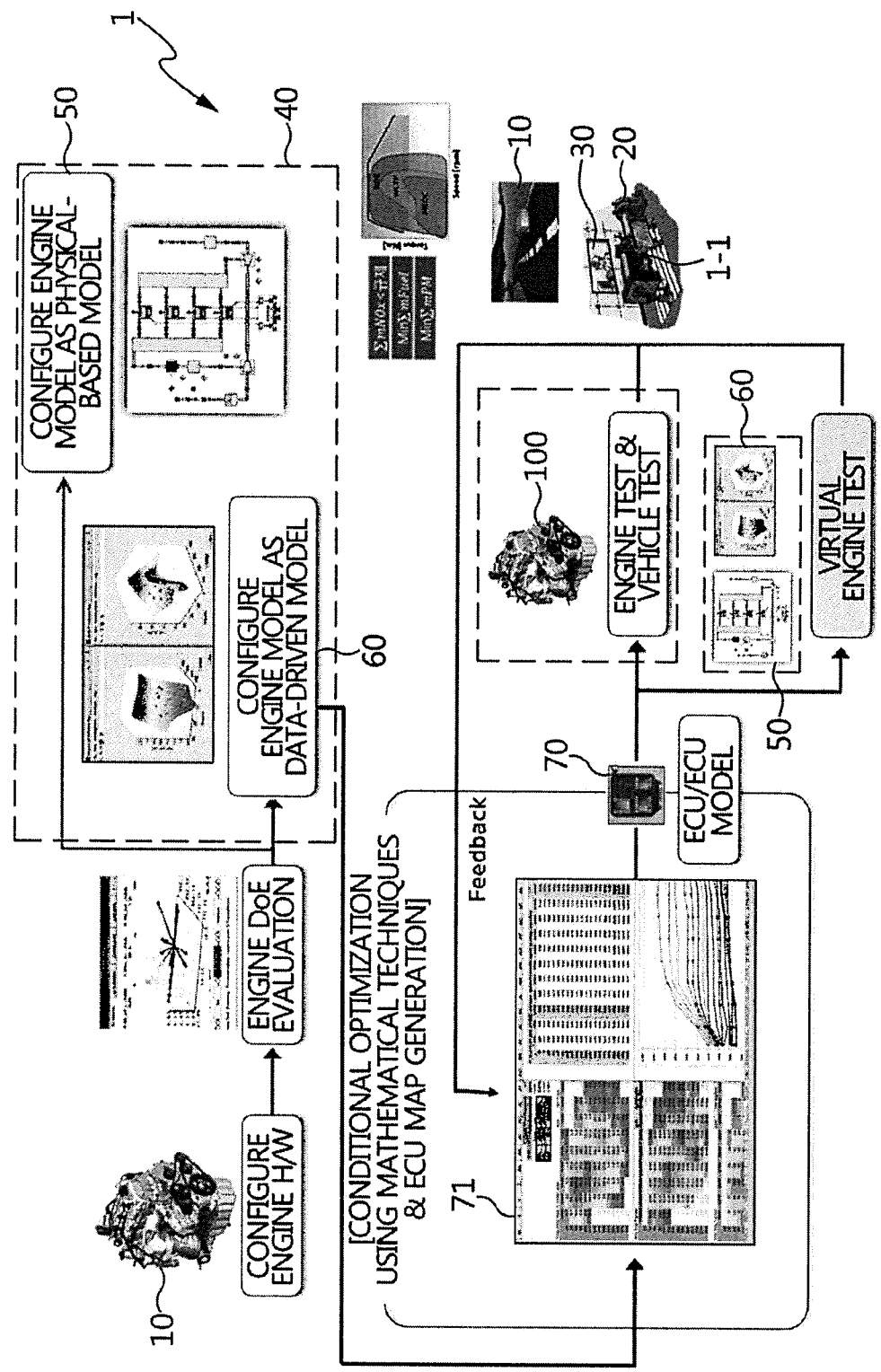
FIG. 5 is the operating state of the engine virtual test environment system when obtaining the virtual test result for EMS mapping according to the present disclosure.
Figure 6:
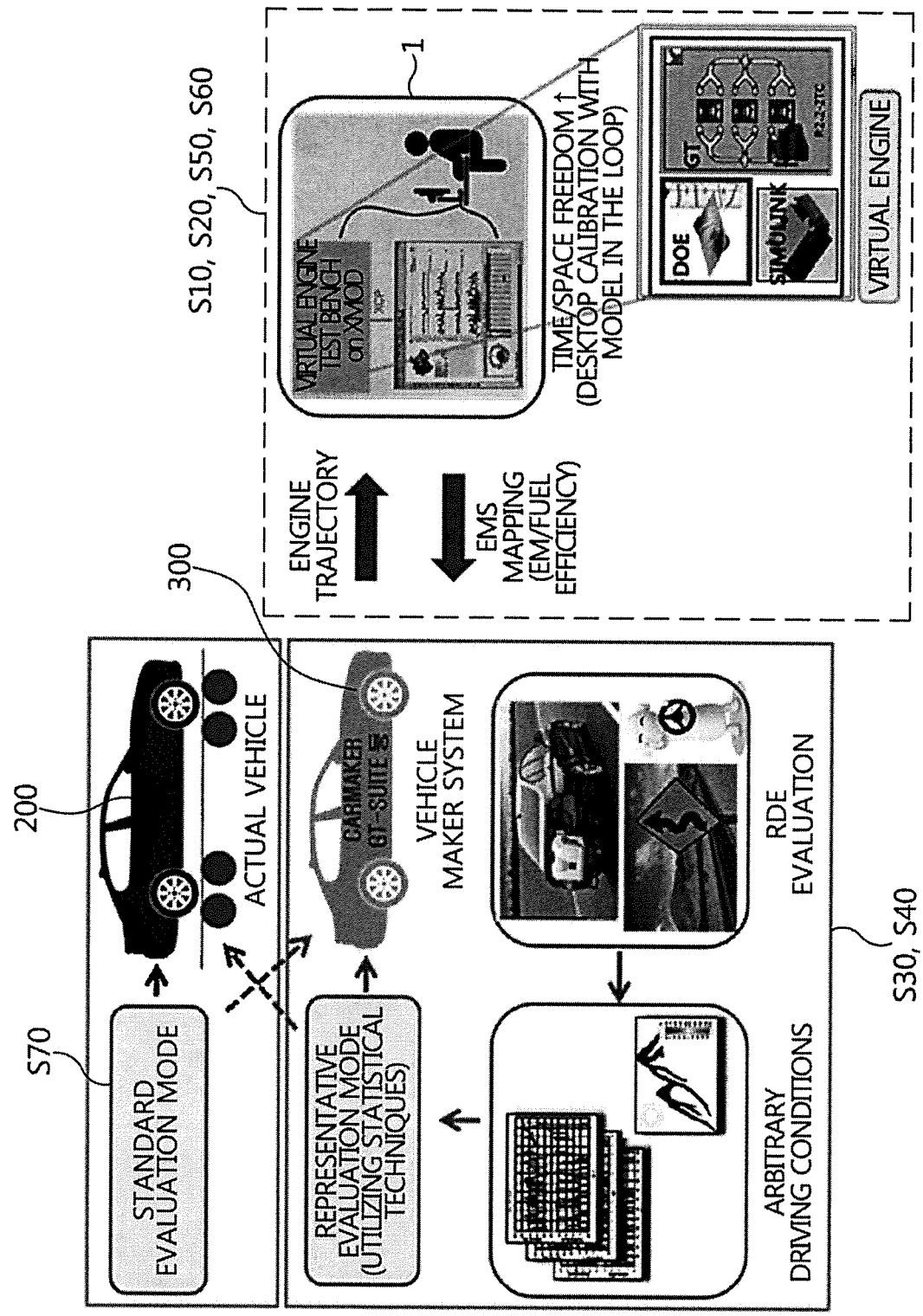
FIG. 6 shows a state in which the actual engine and actual vehicle evaluation are performed by EMS mapping of the virtual test result acquired in the engine virtual test environment system according to the present disclosure.

Meanwhile, FIG. 4 to FIG. 6 illustrate the EMS mapping method applied to the engine using the engine virtual test environment system 1. The following description of the virtual engine 40, physics-based model 50, and data-driven model 60 is simplified for understanding EMS mapping. It should be understood that the actual construction is achieved in detail based on the contents described in FIG. 1.

Referring to FIG. 4, the EMS mapping method applied to the engine may be implemented by a virtual engine construction step S10, a virtual test condition setting step S20, a virtual test execution step S30, a virtual test result acquisition step S40, a virtual test determination step S50, a virtual engine mapping step S60, an actual test evaluation step S70 and an optimization strategy correction step S100.

Referring to FIG. 5, the control lab 30 may apply the engine test evaluation of the test engine model (GLOBAL DoE) to the engine 100 to obtain the engine test data. By using the engine test data, the virtual engine 40 reflecting the engine 100 is constructed as the physics-based 50 and the data-driven model 60, and generates the control target value and transient response condition of the virtual engine 40 using the physics-based model 50 and the data-driven model 60. The control lab 30 may be also linked to the EMS ECU 70 to build the ECU model 71.

Therefore, the virtual engine construction step S10 may be performed in an engine model configuration step S11, an engine model establishment step S12, an ECU map generation step S13, and an ECU model input (mapping) step S14.

For example, in the engine model configuration step S11, the physics-based model 50 may be constructed as the 1-D fast running model based on engine test data of the data-driven model (GLOBAL DOE), and the test engine model 60 may be constructed as a Data Regression Model. In the engine model establishment step S12, the conditionally optimized data-driven model 60 may be constructed by a mathematical technique for modeling the relationship between the output (response) characteristic of the engine to the combination of engine control variables included in the measured engine test data. In the ECU map generation step S13, the ECU map may be generated that applies to the ECU model 71 of EMS using the physics-based model 50 and the conditionally optimized physics-based model 60. In the ECU model input (mapping) step S14, the ECU model may be established by inputting (mapping) the ECU map to the EMS ECU 70 (or the actual ECU 70-1).

In attrition, the virtual test condition setting step S20 may be performed by a control target value generation step S21 and a test model determination step S22.

For example, in the control target value generation step S21, the ECU model may generate a control target value, and the generated control target value may be supplied to a physics-based model current-value output step S32 of the virtual test execution step S30 and a virtual test step S43 using the physics-based model of the virtual test result acquisition step S40. In the test model determination step S22, the transient response is taken into consideration and physics-based 50 is applied when the transient response is considered, whereas the data-driven model 60 is applied when the transient response is not considered.

Referring to FIG. 5, the control lab 30 may implement a virtual test for the virtual engine 40 by driving the engine dynamo 1-1 linked to the target profiler 10, dynamo controller 20 and EMS ECU 70.

Therefore, the virtual test execution step S30 may perform the virtual test with the data-driven model 60 as like a step S31 when the transient response is not considered in the test model determination step S22, but may read the information from physics-based model 50 as like the physics-based model current-value output step S32 and output the current value to reflect in the data-driven model 60 when the transient response is considered in the test model determination step S22. At this case, the current value of the physical engine model may include any one of a combustion chamber internal pressure/temperature, mixer composition, injection timing and injection rate of each multi-injection, fuel injection pressure, multi-stage injection number, fuel injection timing and fuel injection amount, and the like.

In addition, the virtual test result acquisition step S40 may be divided into a test model confidence interval determination step S41, a virtual test result acquisition step S42 and a virtual test supplementation step S43. Therefore, the virtual test result acquisition step S40 may determine whether or not test model confidence interval through the test model confidence interval determination step S41 to a test engine model virtual test data of the step S31, and then, it there is reliability, directly convert the test engine model virtual test data to the virtual test result as like the step S42, whereas, if there is not reliability, supplement the data-driven model virtual test data of the step S31 with the data obtained through the virtual test to the physics-based model 50 of the step S43 to convert to the virtual test result of the step S42.

For example, the test model confidence interval determination step S41 may be a step of determining whether the control target value input to ECU (for example, EMS ECU 70) is within the testing data range when constructed from the data obtained through engine testing under steady-state engine operating conditions in order to obtain the data-driven model 60. Furthermore, it is possible to calculate statistical reliability depending on the change of the control target value input to ECU (for example, EMS ECU 70) and determine whether or not confidence interval by comparing the calculated statistical reliability with specific value.

Referring to FIG. 5, the control lab 30 may grasp the performance characteristics of the virtual engine 40 by analyzing the virtual test data to the physics-based model 50 and the data-driven model 60, change ECU map condition of the EMS ECU 70 through feedback process to optimize the ECU model and perform actual mapping linked to the vehicle ECU. Therefore, in the virtual test determination step S50, it is determined whether the performance, fuel efficiency and EM of the virtual engine 40 grasped as a virtual test of the physics-based model 50 and the data-driven model 60, are satisfied or not.

Therefore, when performance/fuel efficiency/EM are not satisfied in the step S50, it is converted to the optimization strategy correction step S100, and the optimization strategy correction changes the ECU map conditions of the EMS ECU 70 to optimize the ECU model. The ECU model optimization means to change the virtual test conditions of the physics-based model 50 and the data-driven model 60 which do not satisfy performance/fuel efficiency/EM. Therefore, the optimization strategy correction step S100 performs the virtual engine construction step S10 again via the ECU map generation step S13 and the ECU model input (mapping) step S14, and then, repeats the virtual test condition predetermination step S20, the virtual test execution step S30, the virtual test result acquisition step S40, the virtual test determination step S50.

On the other hand, when the performance, fuel efficiency and EM are satisfied in the step S50, it enters into the virtual engine mapping step S60, and the ECU map is input to the vehicle ECU through the virtual engine mapping and then, the actual test evaluation step S70 is performed.

Continuously, the exhaust gas regulation test evaluation using an actual engine and actual vehicle is performed in the actual test evaluation step S70.

FIG. 6 shows that the engine virtual test environment system 1 is linked to an actual vehicle 200 and a vehicle maker system 300 to perform a diesel engine EMS mapping and an actual exhaust gas regulation test evaluation.

As shown in FIG. 6, the actual vehicle 200 is equipped with an engine 100 that is driven the ECU model mapped to an engine condition for optimized performance, fuel efficiency and EM as a virtual test of the virtual engine 40, and exhaust gas regulation tests are divided into a representative evaluation mode using the statistical techniques based on arbitrary driving conditions using the actual vehicle and RDE evaluation and the standard evaluation mode of the NEDC/WLTP.

Particularly, items of arbitrary driving conditions obtained in the representative evaluation mode performed by the accrual vehicle 200 and the RDE evaluation are reflected to the actual vehicle 200 and the vehicle maker system 300, respectively.

Therefore, the engine virtual test environment system 1 receives the feedback of the engine trajectory of the actual vehicle 200 reflecting the ECU model of the virtual engine 40 again from the vehicle maker system 300, re-optimizes the ECU model with the data of the feedback engine trajectory, thereby obtaining a new optimized performance, fuel efficiency and EM through the virtual tests on the physical engine 50 and the test engine model 60.

As a result, the actual vehicle 200 can obtain the satisfactory performance/fuel efficiency/EM of the engine 100 while significantly reducing the number of exhaust gas regulatory test evaluations.

As described above, the engine virtual test environment system 1 according to the present exemplary embodiment for EMS mapping of a gasoline engine or diesel engine generates the virtual engine 40 as the physics-based model 50 constructed by the 1-D Fast Running Model and the data-driven model 60 constructed by the Data Regression Model, implements the virtual test under the virtual test conditions set to the physics-based model 50 and the data-driven model 60 to obtain the optimized data of the performance/fuel efficiency/EM, and tests NEDC/WLTP including the RDE evaluation through the engine 100 in which the optimized performance/fuel efficiency/EM is actually mapped and the vehicle 200, thereby securing the time and space freedom of the EMS mapping which is suitable for various evaluation condition verification which is practically difficult and RDE regulation.

What is claimed is:

1. An engine virtual test environment system comprising:
   a target profiler for an engine dynamo;
   a dynamo controller to control the engine dynamo;
   a virtual engine including a physics-based model and a data-driven model;
   an Engine Management System Electronic Control Unit (EMS ECU) to control the virtual engine;
   a control lab linked to the EMS ECU to implement a virtual engine test for the virtual engine by driving the engine dynamo for Real Driving Emission (RDE) evaluation;
   at least one memory; and
   at least one processor configured to perform the virtual engine test and generate the virtual engine to which the physics-based model and the data-driven model are applied to replace an actual engine of a vehicle, wherein the at least one memory is configured to store
the physics-based model representing an actual structure of the engine by any one of simulation, phenomenological relationship expression, physical characteristic change of constituent elements, a combust model, an electronic control unit (ECU) model, and an engine model, which is predictive based on physics, and the data-driven model representing an actual operation of the engine by any one of a test model, a mathematical model, modeling, engine design of experiments (DoE) techniques, mathematical and statistical techniques, a driving range, an electronic control unit (ECU) model, and an engine model, which is accurate based on measurement, wherein the ECU model is mapped to an engine condition for optimized performance, fuel efficiency and emission material (EM) as a virtual test of the virtual engine, wherein the engine of the vehicle is controlled by the ECU model to perform the RDE evaluation, and wherein the RDE evaluation is tested together with New European Driving Cycle (NEDC) and Worldwide light vehicle test procedure (WLTP).

2. The engine virtual test environment system of claim 1, wherein the physics-based model is a one dimensional (1-D) Fast Running Model or Mean Value Engine Model and the test engine model is a Data Regression Model.

3. The engine virtual test environment system of claim 1, wherein the simulation represents entire characteristics of the engine with an intake system, an exhaust system, a turbocharger, an intercooler, an exhaust gas recirculation (EGR) system, a cylinder, a crankshaft, an intake and exhaust valve, and expresses steady-state and transient response to the engine.

4. The engine virtual test environment system of claim 1, wherein the phenomenological relationship expression describes the phenomenon associated with the flow, combustion and friction inside the cylinder of the engine.

5. The engine virtual test environment system of claim 1, wherein the combust model is configured to generate a combustibility prediction result that predicts the performance, fuel efficiency and emission material (EM) of the engine, the ECU model changes a turbo charger vane opening and an EGR valve opening while generating a fuel injection pressure, a multi-stage injection number, a fuel injection timing, a fuel injection quantity, and the engine model is configured to provide a fast running speed while maintaining the same physical characteristics on an intake system and an exhaust system.

6. The engine virtual test environment system of claim 1, wherein the test model is configured to provide a basic output of the virtual engine, the mathematical model is configured to express a relationship between output characteristics on a combination of engine control variables, and the modeling provides monitoring on the output of a virtual input.

7. The engine virtual test environment system of claim 1, wherein the Engine DoE techniques provide a variation range of an input and an output and input variables, and the mathematical and statistical techniques provide output prediction for specific input conditions and mapping optimization, and cycle cumulative value minimization directions for driving trajectories.

8. The engine virtual test environment system of claim 1, wherein the driving range provides an actual usable range of engine control variables.

9. The engine virtual test environment system of claim 1, wherein the target profiler is configured to acquire a target speed and a target torque profile for an engine dynamo by applying any one of any specified value, a storage profile, or an analysis program.

10. The engine virtual test environment system of claim 1, wherein the dynamo controller is configured to drive and controls the virtual engine depending on the target profiler to provide automation functions for driving mode determination, target profile setting and display and storage of measure values of virtual engine temperature and pressure.

11. The engine virtual test environment system of claim 10, wherein the driving mode determination is achieved by any one of an engine speed and an engine torque, an engine speed and a fuel injection amount, an engine speed and accelerator pedal opening, an engine speed and a Brake Mean Effective Pressure (BMEP).

12. The engine virtual test environment system of claim 1, wherein the control lab is configured to load the physics-based model and the data-driven model into the EMS ECU, perform hardware specification evaluation for the engine with the physics-based model, derive the mapping result for the engine after evaluating the steady-state, transient state and environmental conditions by the data-driven model, and the derived result is applied to the engine and the vehicle for the RDE evaluation.

13. The engine virtual test environment system of claim 1, wherein the EMS ECU is configured to load the physics-based model and the data-driven model into an ECU model to establish the ECU model, and the ECU model is provided with an ECU map to which a control target value generated by receiving from the dynamo controller any one of a fuel injection pressure, a multi-stage injection number, a fuel injection time, a fuel injection amount, a boost pressure, an EGR flow rate of the virtual engine depending on an engine rotation speed and an accelerator pedal opening is applied.

14. The engine virtual test environment system of claim 13, wherein the ECU model is configured to reflect the current value of the physics-based model to the data-driven model when a transient response characteristic is considered.

* * * * *